United States Patent [19]
Kawabata

[11] Patent Number: 5,384,781
[45] Date of Patent: Jan. 24, 1995

[54] AUTOMATIC SKEW CALIBRATION FOR MULTI-CHANNEL SIGNAL SOURCES

[75] Inventor: Frederick Y. Kawabata, Beaverton, Oreg.

[73] Assignee: Tektronix, Inc., Wilsonville, Oreg.

[21] Appl. No.: 652,968

[22] Filed: Feb. 11, 1991

[51] Int. Cl.$^6$ .................. G06K 5/04; G11B 5/00; G06F 11/00

[52] U.S. Cl. ..................... 371/1; 371/47.1; 371/48

[58] Field of Search ............... 371/1, 38.1, 39.1, 47.1, 371/48

[56] References Cited
U.S. PATENT DOCUMENTS

| | | | |
|---|---|---|---|
| 3,230,350 | 1/1966 | Mendelson et al. | 371/1 |
| 3,728,679 | 4/1973 | McIntosh | 340/145.1 F |
| 3,976,940 | 8/1976 | Chau et al. | 371/1 |
| 4,357,702 | 11/1982 | Chase et al. | 371/1 |
| 4,542,505 | 9/1985 | Binoeder et al. | 371/1 |
| 4,637,018 | 1/1987 | Flora et al. | 371/1 |
| 4,700,346 | 10/1987 | Chandran et al. | 371/1 |

Primary Examiner—Robert W. Beausoliel, Jr.
Assistant Examiner—T. Tu
Attorney, Agent, or Firm—Francis I. Gray

[57] ABSTRACT

An automatic skew calibration technique for a multi-channel signal source uses a cross-coupled flip-flop calibration circuit and a microprocessor to align the timing of a pair of signals from the multi-channel signal source. The flip-flop calibration circuit indicates which of the pair of signals is leading, and the microprocessor uses the output of the flip-flop calibration circuit to determine in which signal source to adjust the signal delay. The signal source is incrementally delayed by the microprocessor while the microprocessor also observes the output of the flip-flop calibration circuit. When the flip-flop calibration circuit indicates a time interval over which the relative time position of the input signals changes, then the microprocessor determines a calibrated value for the signal delay, completing skew calibration of the multi-channel signal source.

9 Claims, 2 Drawing Sheets

AUTOMATIC SKEW CALIBRATION FOR MULTI-CHANNEL SIGNAL SOURCES

BACKGROUND OF THE INVENTION

The present invention relates to calibration techniques, and more particularly to an automatic skew calibration technique for multi-channel signal sources to correct for skew in signal sources to maintain the best accuracy.

Correcting for skew in signal sources is an important feature since it is one of the basic timing characteristics of a signal source. Traditionally external instruments, such as oscilloscopes, have been used to view signals as each signal source is manually adjusted. When the signals are aligned in time as viewed on the oscilloscope, then the skew between the signal sources is corrected. However, this cumbersome manual technique that requires an external instrument cannot be readily performed frequently as it is time consuming, so that skew errors may creep into the signals between manual calibrations.

What is desired is an automatic skew calibration technique that does not require any external instruments, and which may be performed frequently to correct for skew errors.

SUMMARY OF THE INVENTION

Accordingly the present invention provides an automatic skew calibration technique for multi-channel signal sources using a pair of cross-coupled flip-flops and a microprocessor. A pair of signal source outputs are input in a cross-coupled fashion to a pair of flip-flops so that one signal clocks one flip-flop with the other signal as an input, and the other signal clocks the other flip-flop with the first signal as an input. The microprocessor tests the output of the flip-flops to determine which signal is leading the other, and then adjusts the leading signal incrementally, testing the flip-flop outputs after each increment, until one flip-flop and then the other flip-flop changes state. The time interval during which the flip-flops are in the same state is divided by two to set the time of the leading signal to be aligned with the other signal. Alternatively once the first flip-flop changes state the leading signal is adjusted to be the trailing signal and then is decrementally adjusted until one of the flip-flops changes state. The time interval between the first flip-flop state change in each direction is averaged to determine the proper skew adjustment for the originally leading signal source.

The objects, advantages and other novel features of the present invention are apparent from the following detailed description when read in conjunction with the appended claims and attached drawing.

DESCRIPTION OF THE PREFERRED EMBODIMENT

Figure 1:
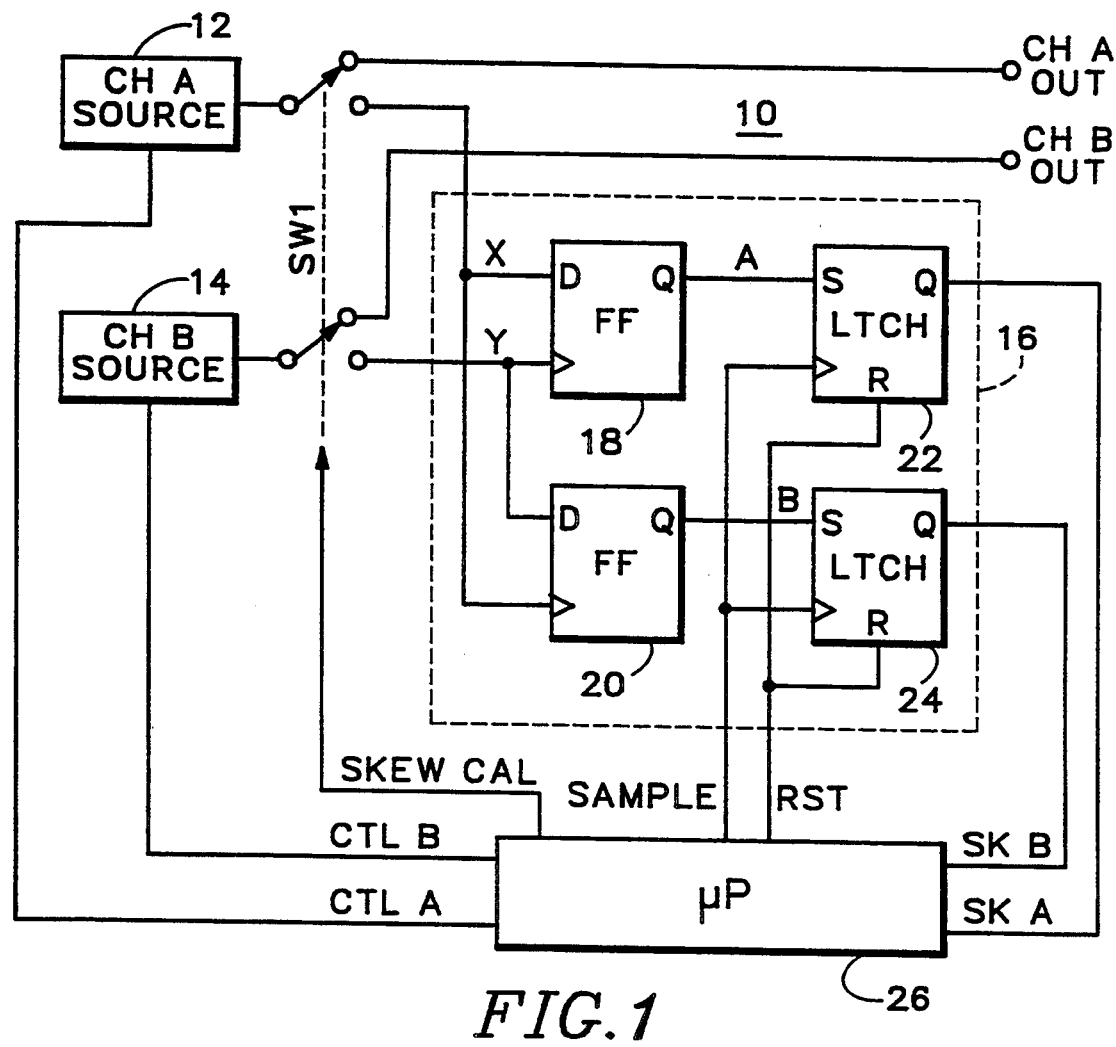
FIG. 1 is a block diagram of a system for automatic skew calibration of a multi-channel signal source according to the present invention.

Referring now to FIG. 1 a multi-channel signal source 10 is shown having a channel A signal source 12 and a channel B signal source 14 to produce output signals CHA, CHB. The outputs of the signal sources 12, 14 are routed by a switch SW1 either to the outputs CHA, CHB or to a calibration circuit 16 for skew calibration between the sources. A pair of cross-coupled flip-flops 18, 20 have the outputs X, Y of the signal sources 12, 14 as inputs, with X being coupled to the D-input of the first flip-flop 18 and to the clock input of the second flip-flop 20, and with Y being coupled to the clock input of the first flip-flop 18 and to the D-input of the second flip-flop 20. The Q-outputs A, B of the flip-flops 18, 20 are input to respective latches 22, 24, the outputs of which form a skew signal SKA, SKB that represents the relative positions of a defined edge of the input signals X, Y.

A microprocessor 26 provides control signals CTLA, CTLB to the respective signal sources 12, 14 that provide an absolute signal delay value for each source. The microprocessor 26 also provides a SKEWCAL signal to the switch SW1 that determines whether the signals from the signal sources 12, 14 are passed to the output CHA, CHB or input to the calibration circuit 16. Finally the microprocessor 26 provides a clock signal SMPL to the clock inputs of the latches 22, 24 to latch the outputs of the flip-flops 18, 20 to produce the skew signal, and resets the latches after each sample of the skew signal has been processed by the microprocessor.

Figure 2:
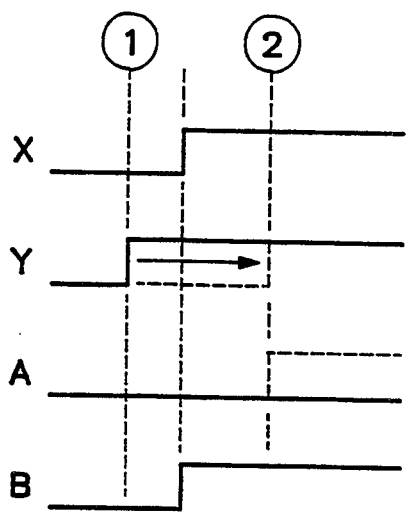
FIG. 2 is a timing diagram of the system of FIG. 1 to illustrate the operation according to the present invention.

As shown in FIG. 2 when a positive leading edge of the Y signal leads the same edge of the X signal, as indicated at position (1), the output A of the first flip-flop 18 is at a low level while the output B of the second flip-flop 20 is at a high level. Alternatively when the positive leading edge of the Y signal trails the same edge of the X signal, as indicated at position (2), the output A of the first flip-flop 18 is at a high level while the output B of the second flip-flop is at a low level. These A, B values are clocked into the latches 22, 24 by the microprocessor 26 with signal SMPL to form the skew signal SKA, SKB for the microprocessor. Alternatively the clock signal SMPL for the latches 22, 24 may be omitted, with the microprocessor 26 reading the outputs of the latches a fixed period of time after the latches are reset by the RST signal.

Figure 3:
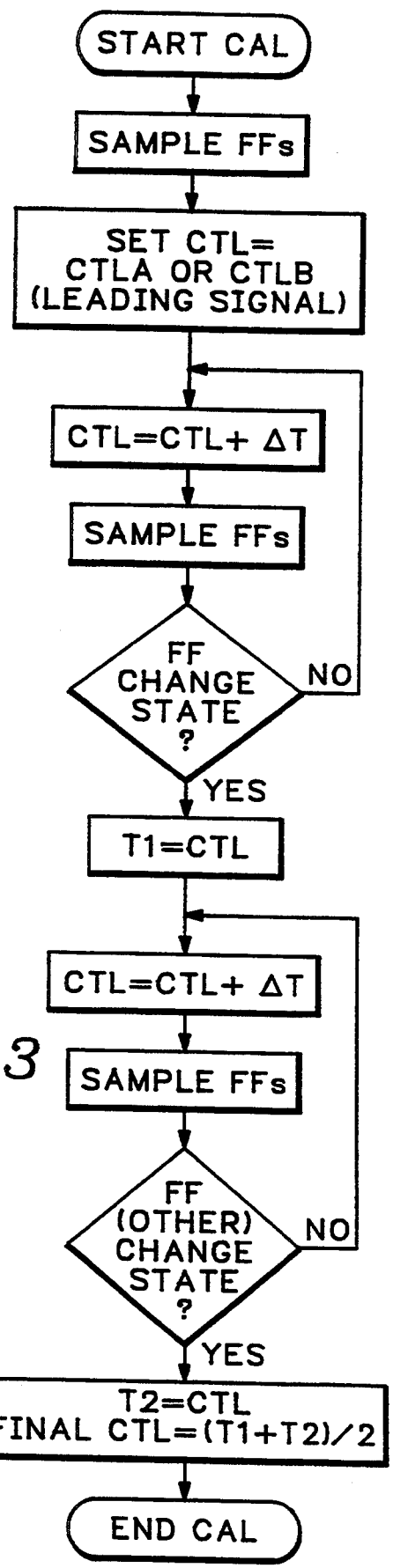
FIG. 3 is a flow chart diagram of the operation of the system of FIG. 1 according to the present invention.

As shown in FIG. 3 to start the skew calibration sequence, the microprocessor 26 transmits the SKEWCAL command to the switch SW1 so that the outputs of the signal sources 12, 14 are input to the calibration circuit 16. The SMPL command from the microprocessor latches the outputs of the flip-flops 18, 20 into the latches 22, 24 to produce the skew signal SKA, SKB. Based upon the states of SKA, SKB the microprocessor 26 increments the signal delay of the X or Y signal determined to be leading by incrementing the appropriate control signal, CTLA or CTLB. The microprocessor 26 resets the latches 22, 24 and then resamples the outputs A, B of the flip-flops 18, 20 to determine if either flip-flop has changed state as a result of the incremental delay change to the leading signal source. This process is reiterated until one of the flip-flops 18, 20 changes state, at which time the value of the varying control signal CTL is stored as a first delay value T1. The varying control signal CTL continues following the above process until the other flip-flop 18, 20 changes state. At this time the value of the varying control signal CTL is stored as a second time value T2. The microprocessor 26 then determines the mid-point between T1 and T2 and sets the varying control signal CTL to the determined value, completing the skew calibration.

Figure 5:
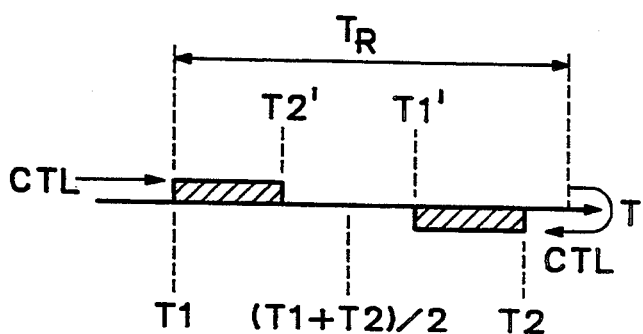
FIG. 5 is a diagram illustrating the operation of the present invention according to the flow chart diagram of FIG. 4.
Figure 4:
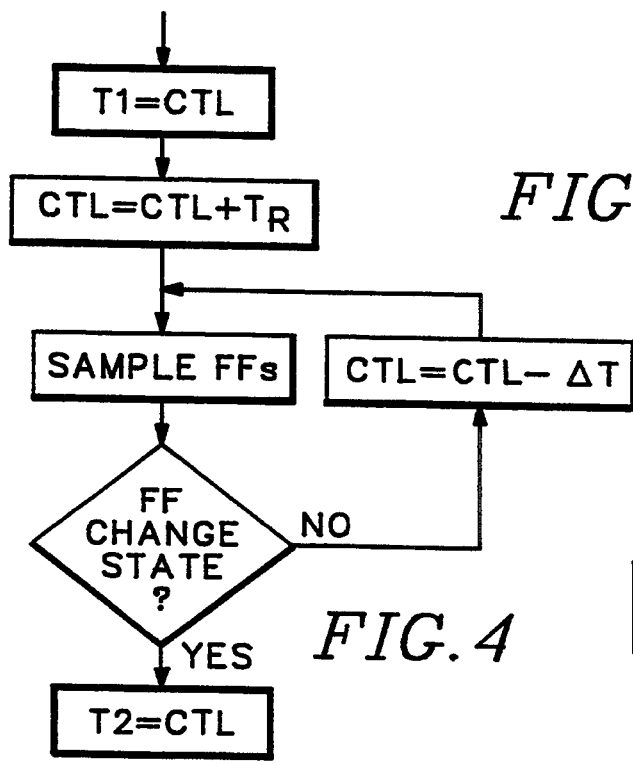
FIG. 4 is an alternative partial flow chart diagram of the operation of the system of FIG. 1 according to the present invention.

Alternatively as shown in FIG. 4 once the T1 of the varying control signal CTL is determined, then the varying control signal is adjusted so that the signal source 12, 14 that was originally the leading signal source becomes definitely the trailing signal source as indicated by the states of the flip-flops 18, 20. Then CTL is decremented until one of the flip-flops 18, 20 changes state, and this value of CTL is recorded as T2. Then CTL is set to the average of T1 and T2 as before. This is a refinement of the process illustrated in FIG. 3 necessitated by the fact that for some flip-flop devices, as shown in FIG. 5, there is a definite difference in the times at which the flip-flops change state depending upon the direction the varying control signal CTL is being incremented/decremented. Using the process of FIG. 3 for such flip-flop devices in an extreme case results in a time T2' as the second time for averaging, yet when approached from the opposite direction time T2 is much greater than T2' and in fact even time T1' is greater than T2'. Therefore the process of FIG. 4 assures these variations in device characteristics are accounted for to achieve the best possible average for the setting of the varying control signal CTL to produce the least amount of actual skew between the two signal sources 12, 14.

Since the calibration process is microprocessor controlled and requires no operator interaction, the calibration may be performed as frequently as desired on a non-interference basis. The only operator input would be to set the frequency of the automatic skew calibration process, or alternatively to manually initiate the calibration process.

Thus the present invention provides an automatic skew calibration for a multi-channel signal source that uses cross-coupled flip-flops together with a microprocessor to determine which signal leads the other, and then adjusts the delay of the leading signal until the two signals are aligned in time, correcting the skew between the signals.

What is claimed is:

1. An apparatus for automatic skew calibration of a multi-channel signal source comprising:
   means for generating a skew signal indicative of which one of two input signals from the multi-channel signal source is a leading signal;
   means in response to the skew signal for varying a delay for the leading signal to incrementally change a timing relationship between the leading signal and the other signal of the two input signals;
   means for determining from changes in the skew signal in response to the varying of the delay a calibrated value for the delay so that the two input signals are aligned in time.

2. An apparatus as recited in claim 1 wherein the generating means comprises a first D-type flip-flop and a second D-type flip-flop, each D-type flip-flop having a D-input, a clock input and an output, having cross-coupled inputs so that one of the two input signals is input to the D-input of the first flip-flop and the clock input of the second flip-flop, and the other of the two input signals is input to the clock input of the first flip-flop and the D-input of the second flip-flop, the outputs of the flip-flops forming the skew signal.

3. An apparatus as recited in claim 2 wherein the generating means further comprises a pair of latches coupled to respective ones of the flip-flops to store the outputs of the flip-flops for input to the varying and determining means.

4. A method of performing automatic skew calibration in a multi-channel signal source comprising the steps of:
   determining from a pair of input signals from the multi-channel signal source a skew signal indicative of which one of the pair of input signals is a leading signal;
   incrementing a delay in the source of the leading signal while continuously determining from the skew signal which signal from the pair of input signals is the leading signal; and
   setting the delay in the source to a calibrated value when the leading signal changes relative position in time with the other signal of the pair of input signals.

5. A method as recited in claim 4 wherein the determining step comprises the steps of:
   inputting the pair of input signals to a first D-type flip-flop and a second D-type flip-flop, each D-type flip-flop having a D-input, a clock input and an output, in a cross-coupled manner so that one of the input signals is coupled to the D-input of the first flip-flop and to the clock input of the second flip-flop and the other of the input signals is coupled to the clock input of the first flip-flop and to the D-input of the second flip-flop, the outputs of the flip-flops being the skew signal; and
   determining from the skew signal which of the input signals is the leading signal.

6. A method as recited in claim 5 wherein the incrementing step comprises the steps of:
   incrementing the delay of the source of the leading signal;
   determining from the skew signal whether the output of one of the flip-flops changes state in response to the incremented delay;
   equating a first delay value to the value of the delay when the output of one of the flip-flops changes state;
   repeating the incrementing and determining steps until the other of the flip-flops changes state; and
   equating a second delay value to the value of the delay when the output of the other of the flip-flops changes state.

7. A method as recited in claim 6 wherein the setting step comprises the steps of:
   calculating from the first and second delay values the calibrated value for the delay; and
   setting the delay to the calibrated value.

8. A method as recited in claim 5 wherein the setting step comprises the steps of:
   incrementing the delay of the source of the leading signal;
   determining from the skew signal whether the output of one of the flip-flops changes state in response to the incremented delay;
   equating a first delay value to the value of the delay when the output of one of the flip-flops changes state;

adjusting the delay so that the leading signal definitively becomes a trailing signal;
decrementing the delay;
determining from the skew signal whether the output of one of the flip-flops changes state in response to the decremented delay; and
equating a second delay value to the value of the delay when the output of the one flip-flop changes state.

9. A method as recited in claim 8 wherein the setting step comprises the steps of:
calculating from the first and second delay values the calibrated value for the delay; and
setting the delay to the calibrated value.

* * * * *